(12) United States Patent
Xu et al.

(10) Patent No.: US 11,442,091 B2
(45) Date of Patent: Sep. 13, 2022

(54) APPARATUS AND METHODS FOR DETERMINATION OF CAPACITIVE AND RESISTIVE CHARACTERISTICS OF ACCESS LINES

(71) Applicant: MICRON TECHNOLOGY, INC., Boise, ID (US)

(72) Inventors: Dan Xu, Sunnyvale, CA (US); Jun Xu, Shanghai (CN); Erwin E. Yu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 16/877,710

(22) Filed: May 19, 2020

(65) Prior Publication Data

US 2021/0199703 A1 Jul. 1, 2021

Related U.S. Application Data

(60) Provisional application No. 62/954,079, filed on Dec. 27, 2019.

(51) Int. Cl.
| | |
|---|---|
| *G01R 27/26* | (2006.01) |
| *G11C 16/08* | (2006.01) |
| *G11C 16/04* | (2006.01) |
| *G01R 27/08* | (2006.01) |

(52) U.S. Cl.
CPC ......... *G01R 27/2605* (2013.01); *G01R 27/08* (2013.01); *G11C 16/0483* (2013.01); *G11C 16/08* (2013.01)

(58) Field of Classification Search
CPC .... G01R 27/08; G01R 27/2605; G11C 16/08; G11C 16/0483; G11C 29/50008; G11C 29/025
See application file for complete search history.

(56) References Cited

U.S. PATENT DOCUMENTS

| | | | | |
|---|---|---|---|---|
| 2003/0147270 A1* | 8/2003 | Baker | ............... | G11C 11/1673 365/148 |
| 2005/0122767 A1* | 6/2005 | Perner | .................... | G11C 11/16 365/158 |

OTHER PUBLICATIONS

Saeed, Ahmed, "The Wire Modeling," Future University in Egypt Faculty of Engineering and Technology, Apr. 27, 2016, pp. 68.

\* cited by examiner

*Primary Examiner* — Amy He
(74) *Attorney, Agent, or Firm* — Dicke, Billig & Czaja, PLLC

(57) ABSTRACT

Apparatus having an array of memory cells and a controller for access of the array of memory cells, wherein the controller is configured to cause the apparatus to determine capacitance and/or resistance values of an access line in response to applying a reference current to the access line, wherein the access line is connected to control gates of memory cells of the array of memory cells.

20 Claims, 11 Drawing Sheets

APPARATUS AND METHODS FOR DETERMINATION OF CAPACITIVE AND RESISTIVE CHARACTERISTICS OF ACCESS LINES

RELATED APPLICATION

This application claims the benefit of U.S. Provisional Application No. 62/954,079, filed on Dec. 27, 2019, hereby incorporated herein in its entirety by reference.

TECHNICAL FIELD

The present disclosure relates generally to integrated circuits, and, in particular, in one or more embodiments, the present disclosure relates to apparatus and methods for determination of capacitive and resistive characteristics of access lines.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Due to variabilities generally inherent in the fabrication of memory, physical attributes of various circuit components often vary among different memories, or among different portions of a single memory. As a result, different operational parameters, e.g., voltage levels or timing characteristics, might be used for different memories, or different portions of a single memory, to yield similar operational results. Determination of these operational parameters might involve performing testing on a memory including a variety of access operations using an initial set of operational parameters to establish a baseline operating characteristic, and adjusting the operational parameters in response to results of the testing until desired operating characteristic is obtained.

DETAILED DESCRIPTION

Figure 1:
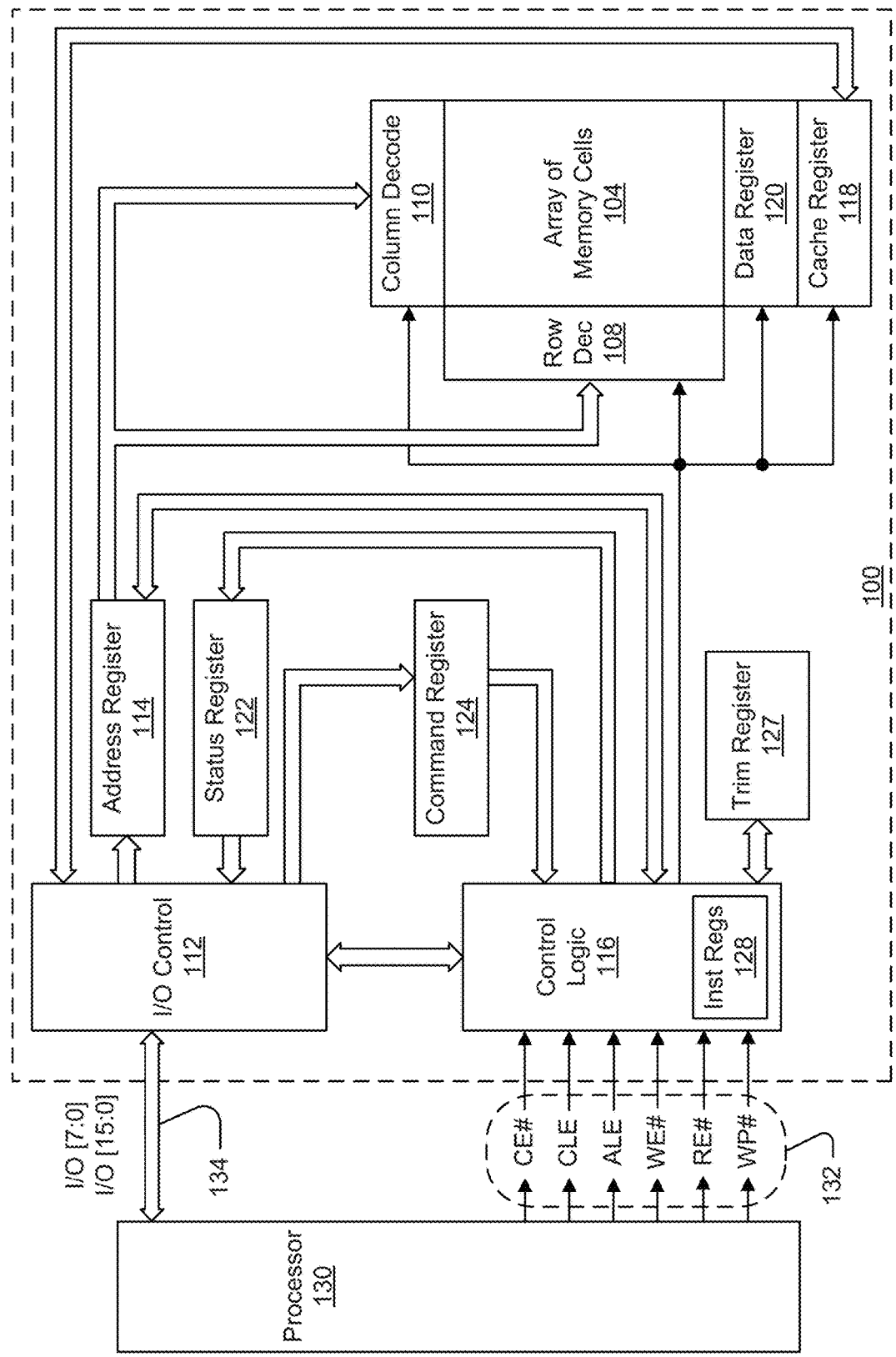
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context.

Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 127 may be in communication with the control logic 116. The trim register 127 might represent a volatile memory, latches or other storage location, volatile or non-volatile. For some embodiments, the trim register 127 might represent a portion of the array of memory cells 104. The trim register 127 might store information relating to the determination of capacitance and resistance values of access lines, in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
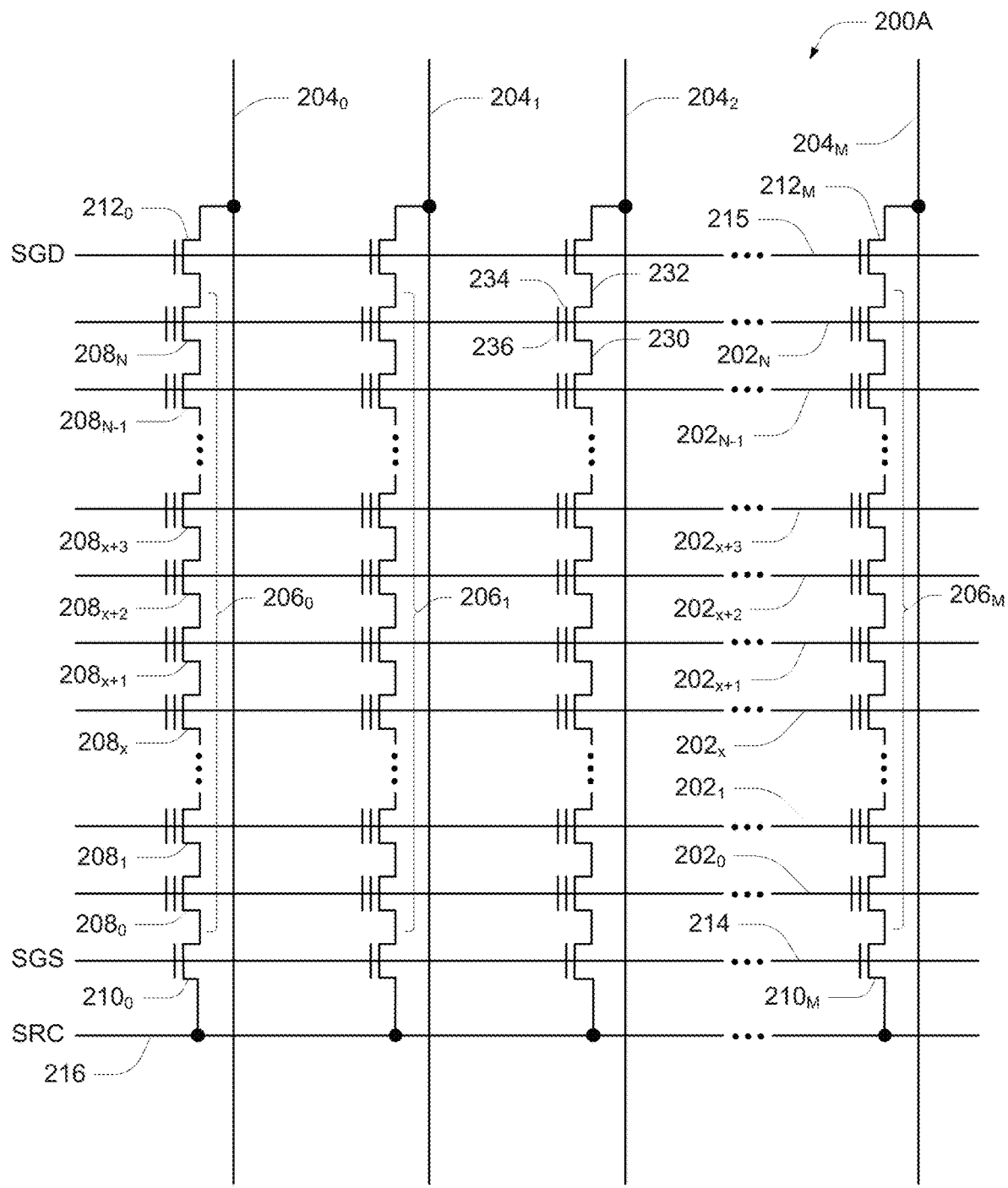
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
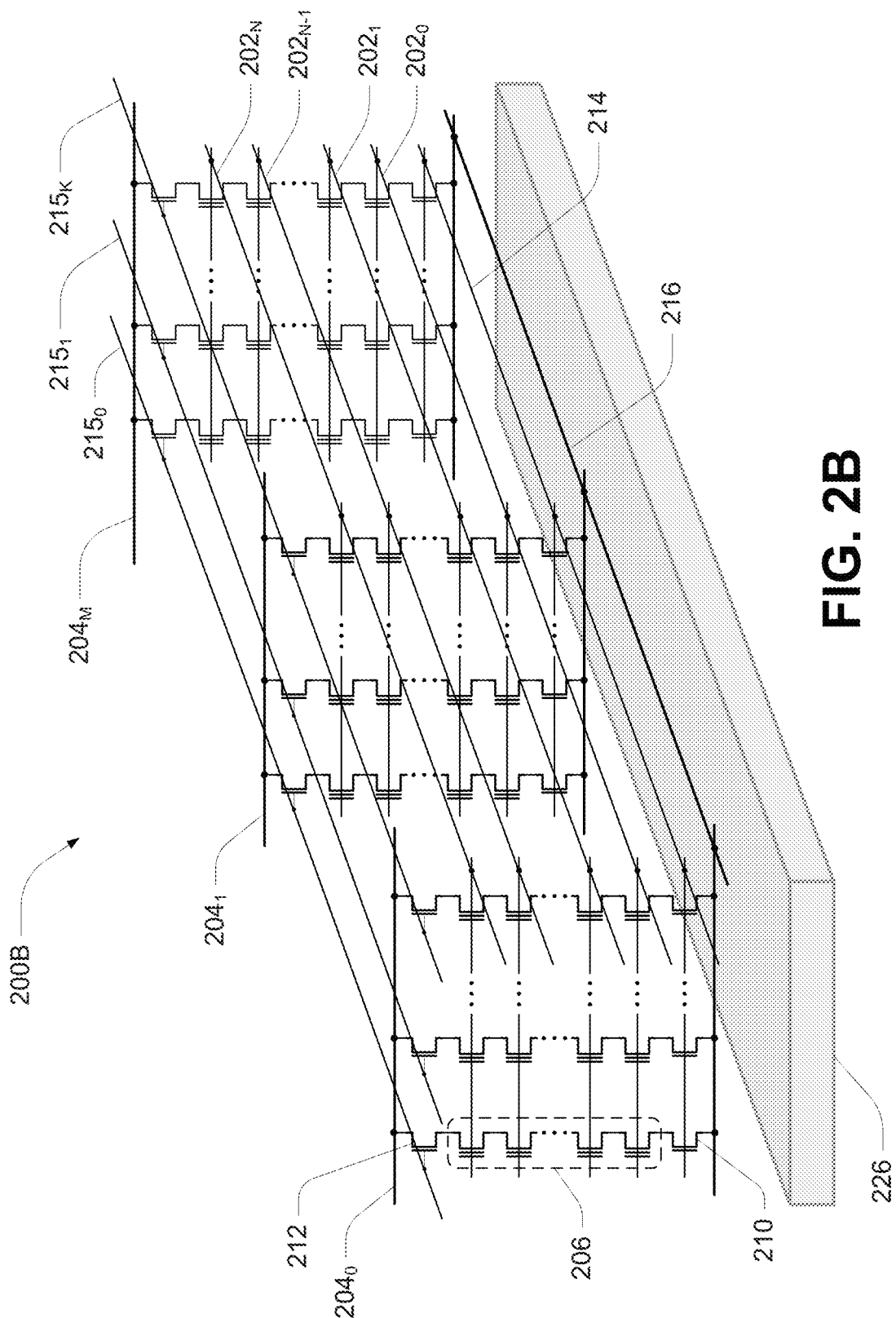

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
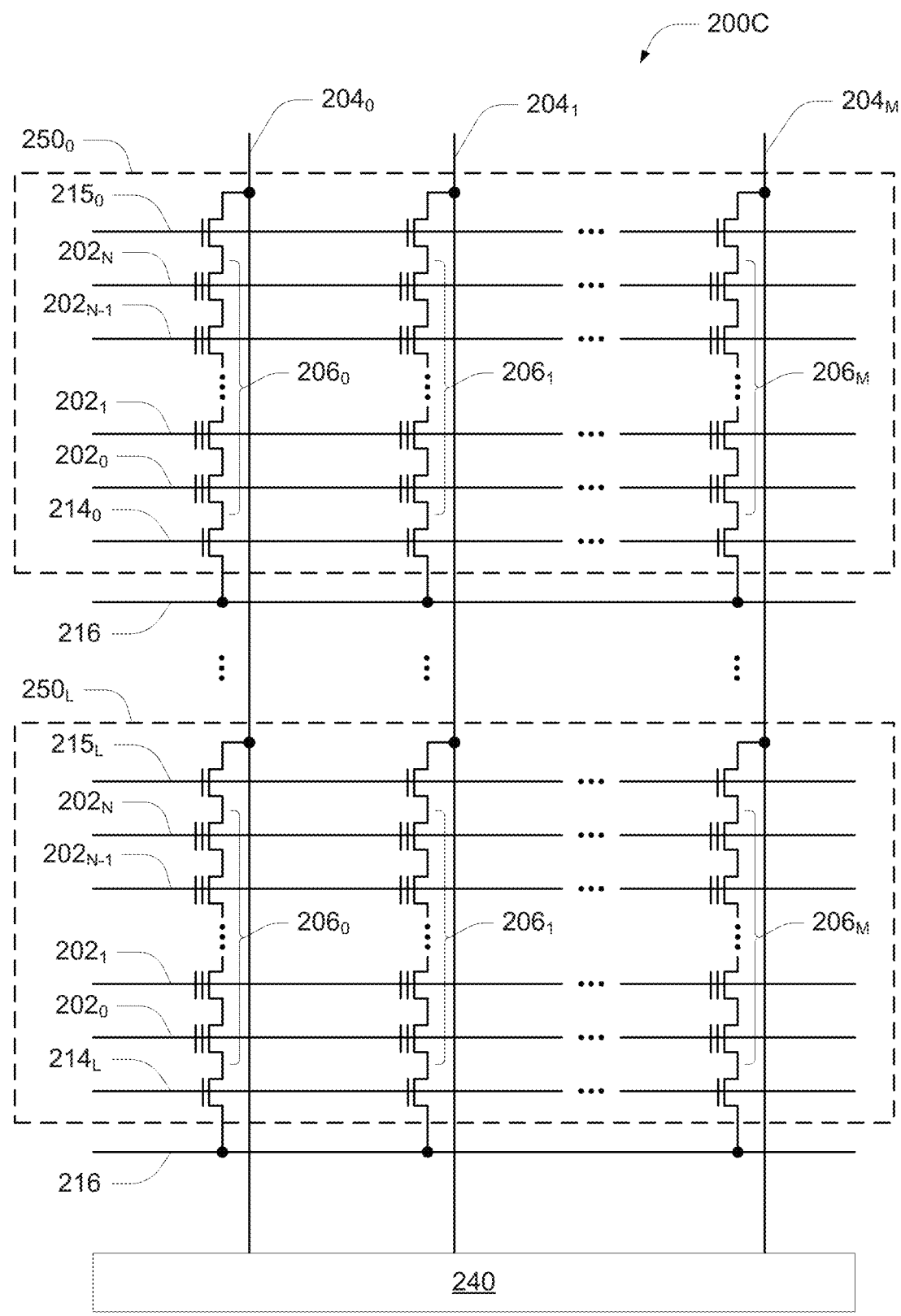

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

Figure 3:
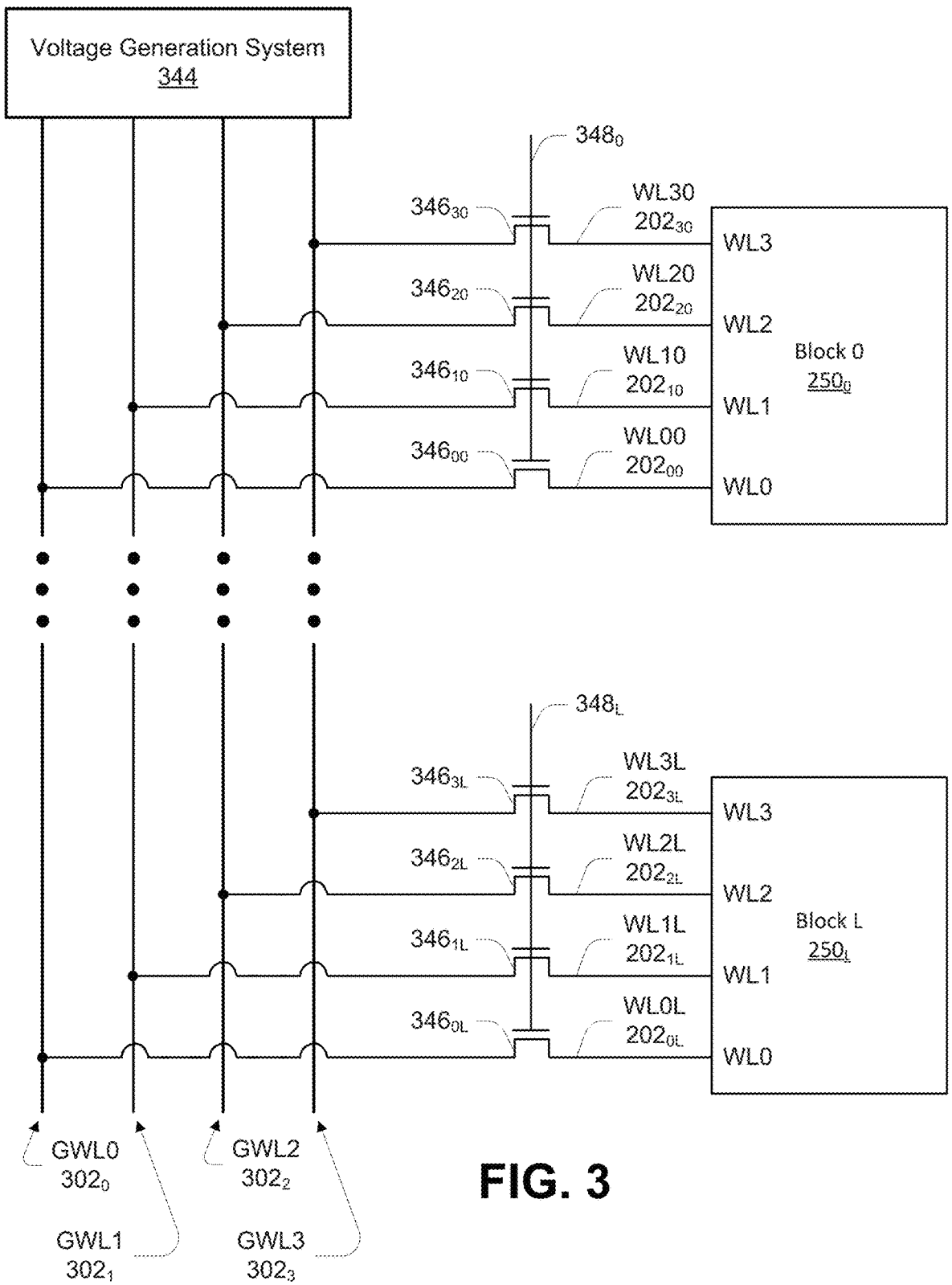
FIG. 3 is a block schematic of a portion of an array of memory cells and string drivers as could be used in a memory device of the type described with reference to FIG. 1.

FIG. 3 is a schematic of a portion of an array of memory cells and string drivers as could be used in a memory device of the type described with reference to FIG. 1 and depicting a many-to-one relationship between local access lines (e.g., local word lines) 202 and global access lines (e.g., global word lines) 302.

As depicted in FIG. 3, a plurality of blocks of memory cells 250 might have their local access lines (e.g., local word lines) 202 commonly selectively connected to a plurality of global access lines (e.g., global word lines) 302. For simplicity, drain select lines and source select lines, and their corresponding transistors, are not depicted. Although FIG. 3 depicts only blocks of memory cells $250_0$ and $250_L$ (Block 0 and Block L), additional blocks of memory cells 250 might have their local access lines 202 commonly connected to global access lines 302 in a like manner. Similarly, although FIG. 3 depicts only four local access lines 202, blocks of memory cells 250 might include fewer or more local access lines 202. The blocks of memory cells $250_0$-$250_L$ might belong to a single plane of memory cells.

To facilitate memory access operations to specific blocks of memory cells 250 commonly coupled to a given set of global access lines 302, each block of memory cells 250 might have a corresponding set of block select transistors 346 in a one-to-one relationship with their local access lines 202. Control gates of the set of block select transistors 346 for a given block of memory cells 250 might have their control gates commonly connected to a corresponding block select line 348. For example, for block of memory cells $250_0$, local access line $202_{00}$ might be selectively connected to global access line $302_0$ through block select transistor $346_{00}$, local access line $202_{10}$ might be selectively connected to global access line $302_1$ through block select transistor $346_{10}$, local access line $202_{20}$ might be selectively connected to global access line $302_2$ through block select transistor $346_{20}$, and local access line $202_{30}$ might be selectively connected to global access line $302_3$ through block select transistor $346_{30}$, while block select transistors $346_{00}$-$346_{30}$ are responsive to a control signal received on block select line $348_0$. The block select transistors 346 for a block of memory cells 250 might collectively be referred to as a string driver, or simply driver circuitry. Such driver circuitry might be formed in the peripheral circuitry 226, for example. Each block select transistor 346 might represent a selective connection of a local access line to its respective global access line. A voltage generation system 344 might be connected (e.g., selectively connected) to each global access line 302 to apply respective voltage levels to each global access line 302 for performing access operations. The voltage generation system 344 might be responsive to control signals received from a controller, e.g., the control logic 116. The voltage generation system 344 might further be configured to generate other voltage levels for use by various embodiments.

Figure 4:
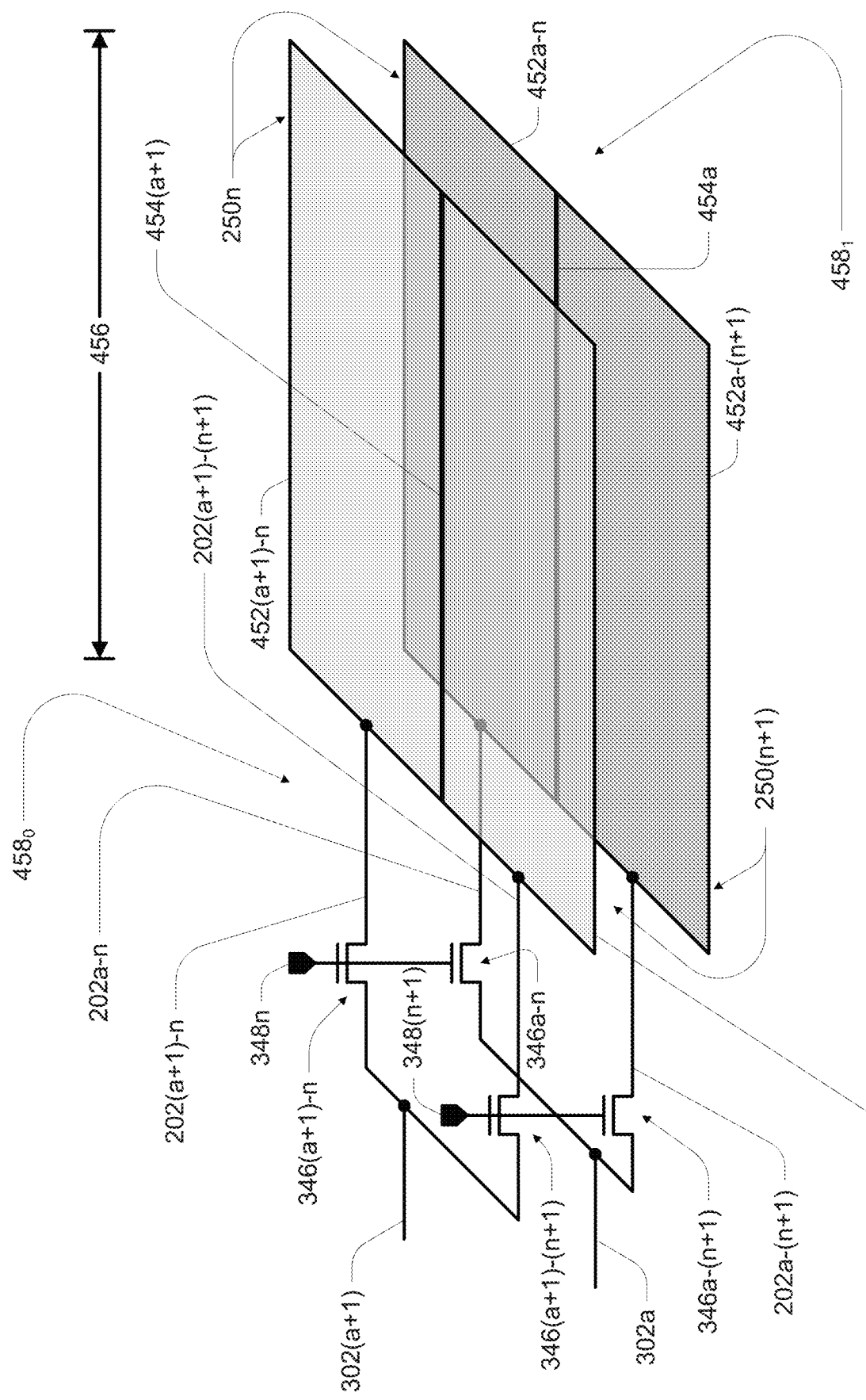
FIG. 4 is a conceptual perspective view of a memory array structure for use with various embodiments.

FIG. 4 is a conceptual perspective view of a memory array structure for use with various embodiments. As noted with regard to FIG. 2B, memory array structures might have tiers where multiple rows of memory cells have their access lines commonly connected. This might take the form of a number of conductive plates. FIG. 4 depicts how such conductive plates might be connected to global access lines.

FIG. 4 depicts two tiers of two different blocks of memory cell, e.g., two tiers corresponding to two respective global access lines, e.g., global access line 302a and global access line 302(a+1), for each of two different blocks of memory cells, e.g., block of memory cells 250n and 250(n+1). The block of memory cells 250n of FIG. 4 might correspond to the block of memory cells $250_0$ of FIG. 3, while the block of memory cells 250(n+1) of FIG. 4 might correspond to the block of memory cells $250_L$ of FIG. 3, for example. Similarly, the global access line 302(a+1) of FIG. 4 might correspond to the global access line $302_3$ of FIG. 3, while the global access line 302a of FIG. 4 might correspond to the global access line $302_2$ of FIG. 3, for example.

The global access line 302a might be selectively connected to a local access line 202a-n for the block of memory cells 250n through a block select transistor 346a-n, and might be selectively connected to a local access line 202a-(n+1) for the block of memory cells 250(n+1) through a block select transistor 346a-(n+1). The global access line 302(a+1) might be selectively connected to a local access line 202(a+1)-n for the block of memory cells 250n through a block select transistor 346(a+1)-n, and might be selectively connected to a local access line 202(a+1)-(n+1) for the block of memory cells 250(n+1) through a block select transistor 346(a+1)-(n+1). The block select transistors 346a-n and 346(a+1)-n might have their control gates connected to a block select line 348n. The block select transistors 346a-(n+1) and 346(a+1)-(n+1) might have their control gates connected to a block select line 348(n+1).

The local access line 202a-n might be connected to a conductive plate 452a-n, which might form a portion of the local access line 202a-n. The local access line 202(a+1)-n might be connected to a conductive plate 452(a+1)-n, which might form a portion of the local access line 202(a+1)-n. The local access line 202a-(n+1) might be connected to a conductive plate 452a-(n+1), which might form a portion of the local access line 202a-(n+1). The local access line 202(a+1)-(n+1) might be connected to a conductive plate 452(a+1)-(n+1), which might form a portion of the local access line 202(a+1)-(n+1). The conductive plates 452a-n and 452a-(n+1) might be fabricated as a contiguous conductive plate, and then isolated from each other by removing a portion of the contiguous conductive plate along its length 456, and filling a resulting void with a dielectric material to form the isolation region 454. The isolation region 454 might be formed of a dielectric material, for example. The conductive plates 452(a+1)-n and 452(a+1)-(n+1) might be fabricated as a contiguous conductive plate, and then isolated from each other by removing a portion of the contiguous conductive plate, and filling a resulting void with a dielectric material to form the isolation region 454(a+1). The isolation region 454(a+1) might be formed of a dielectric, for example.

Each local access line 202 might have a near end $458_0$ nearest its selective connection to its respective global access line 302. For example, the near end $458_0$ of the local access line 202(a+1)-n might be the end of the local access line 202(a+1)-n connected to the block select transistor 346(a+1)-n. Each local access line might have a far end $458_1$ opposite its selective connection to its respective global access line 302. For example, the far end $458_1$ of the local access line 202(a+1)-n might be the end of the conductive plate 452(a+1)-n opposite its connection to the block select transistor 346(a+1)-n.

Figure 5:
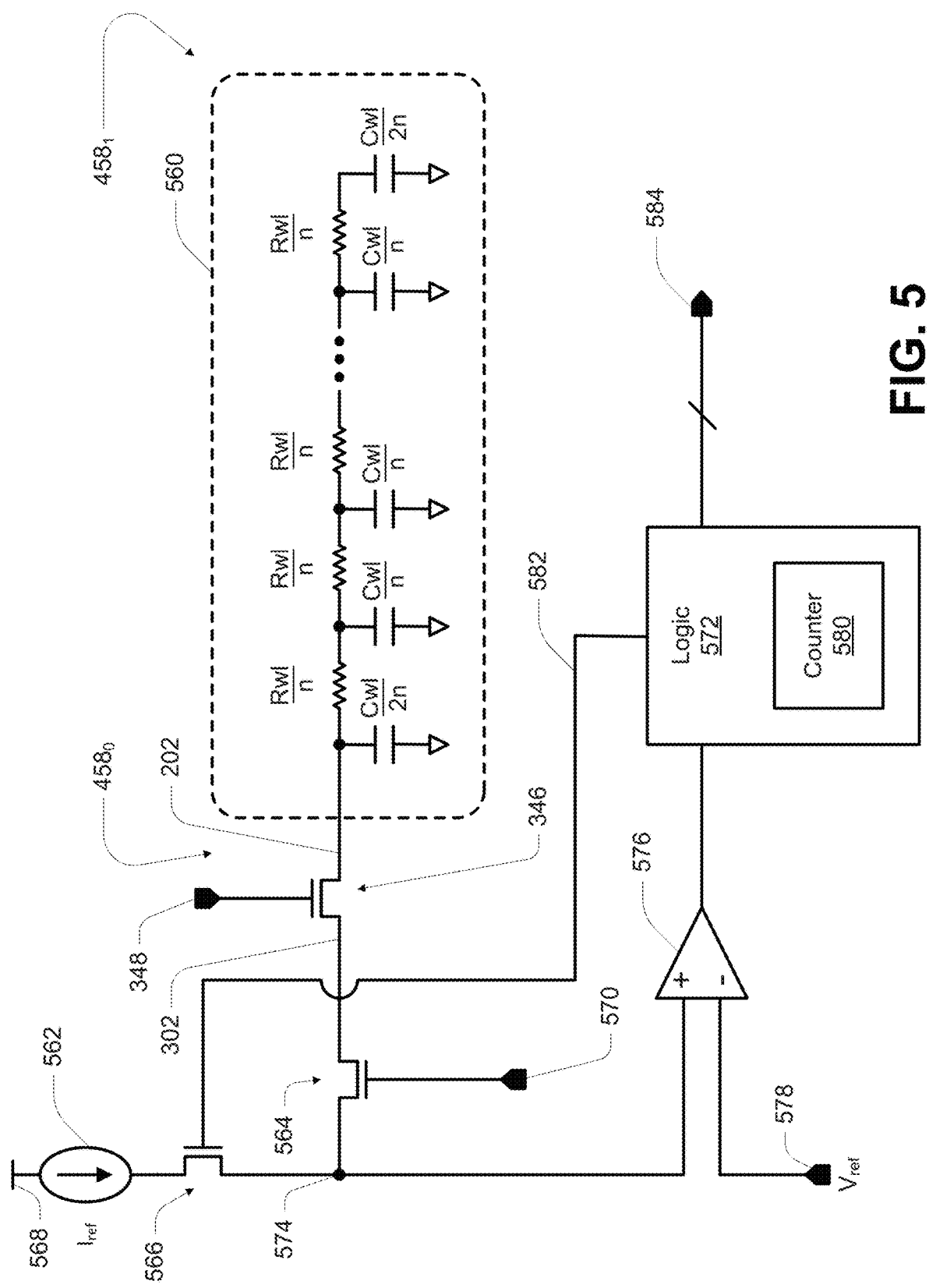
FIG. 5 is a schematic of connections to an access line in accordance with an embodiment as could be used for performing testing in accordance with an embodiment.

FIG. 5 is a schematic of connections to an access line (e.g., local access line 202) in accordance with an embodiment for testing in accordance with an embodiment. Like reference numbers in FIG. 5 correspond to their description in FIGS. 2A-4. The local access line 202 might be represented by a distributed RC model 560. The distributed RC model 560 might be a Pi (or Π) model as depicted in FIG. 5. Other distributed RC models, e.g., a Tau (or T) model, might also be used. Regardless of the chosen model, distributed RC models generally include resistances connected in series and capacitances connected in parallel. For the depicted Pi model, the distributed RC model 560 might include n resistances connected in series and having resistance values of Rwl/n, where Rwl might represent the total resistance of the local access line 202. The distributed RC model 560 might further include n+1 capacitances connected in parallel, where n−1 of the capacitances have capacitance values of Cwl/n, and initial and end capacitances might have capacitance values of Cwl/2n, where Cwl might represent the total capacitance of the local access line 202. As the value of n approaches larger values, such as infinity, the distributed RC model 560 might tend to more accurately reflect the behavior of voltage differences across the local access line 202.

The global access line 302 might be selectively connected to a current source 562, through a transistor (e.g., nFET) 564 and a transistor (e.g., nFET) 566. The current source 562 (e.g., a current mirror) might be connected to a voltage node 568, which might be configured to receive a top-rail supply voltage, such as the supply voltage Vcc. The current source 562 might generate the known current level Iref. Note that the connection of the global access line 302 to voltage generation circuitry, e.g., for generating and applying voltage levels for normal access operations, is not depicted in FIG. 5 for simplicity.

The transistor 564 might be a global access line select transistor to selectively connect global access line 302 to other circuitry, such as a voltage generation system configured to provide varying voltage levels for access of the array of memory cells. The transistor 564 might be responsive to a control signal received on node 570. The transistor 566 might be an enable transistor for testing as described herein. The transistor 566 might be responsive to a control signal received from logic 572, which might represent a portion (e.g., function) of a controller, e.g., the control logic 116.

Upon activation of the transistors 564 and 566, the node 574 might be connected to the global access line 302 and to the current source 562. The node 574 might further be connected to a first input (e.g., a non-inverting input) of a comparator 576. A second input (e.g., an inverting input) of the comparator 576 might be connected to a voltage node 578. The voltage node 578 might be configured to receive a variable voltage level Vref, e.g., from a voltage generation system. The comparator 576 further includes an output connected to the logic 572. By varying the voltage level of the voltage node 578 while applying the current level Iref to the global access line 302, a transition of the output of the comparator 576 might be used to indicate to the logic 572 whether a voltage level of the global access line 302, responsive to the application of the current level Iref, is higher than, or lower than, the voltage level of the variable voltage level Vref. The logic 572 might include a counter 580, a first output 582 in communication with (e.g., connected to) the control gate of the transistor 566, and a second output 584, which might be provided to a controller, e.g., the control logic 116. The counter 580 might be a clocked counter, and might increment a count in response to an associated clock signal, e.g., one increment of the counter 580 for each cycle of the associated clock signal. In this manner, by knowing the period of the associated clock signal, each increment of the count of the counter 580 might represent a same period of time, and each increasing count value of the counter 580 might represent a respective (e.g., increasing) difference in time from an initial count value (e.g., a count value of zero).

Capacitive characteristics of the access line 202 might be determined (e.g., estimated) by applying a known current level, e.g., the reference current Iref, to the node 574 and determining a time difference between a first event, e.g., a time when the voltage level of the node 574 exceeds a first voltage level, and a second event, e.g., a time when the voltage level of the node 574 exceeds a second voltage level higher than the first voltage level. Knowledge of the current level of the reference current Iref, the time difference between the first event and the second event, and the voltage difference between the second voltage level and the first voltage level, might be used to determine a capacitance value for the access line 202. In addition, resistive characteristics of the access line might be determined (e.g., estimated) by applying a known current level, e.g., the reference current Iref, to the node 574, isolating the node 574 from the reference current Iref in response to the voltage level of the node 574 exceeding (e.g., becoming higher than) a particular voltage level, and determining a resting voltage level of the node 574 after isolating it from the reference current Iref. Knowledge of the current level of the reference current Iref, and the voltage difference between the particular voltage level and the resting voltage level, might be used to determine a resistance value for the access line 202.

Various embodiments facilitate measurement of capacitive and/or resistive characteristics of access lines. Measurement of capacitive and/or resistive characteristics of access lines might be used to more accurately determine operational parameters, e.g., voltage levels or timing characteristics.

Figure 6:
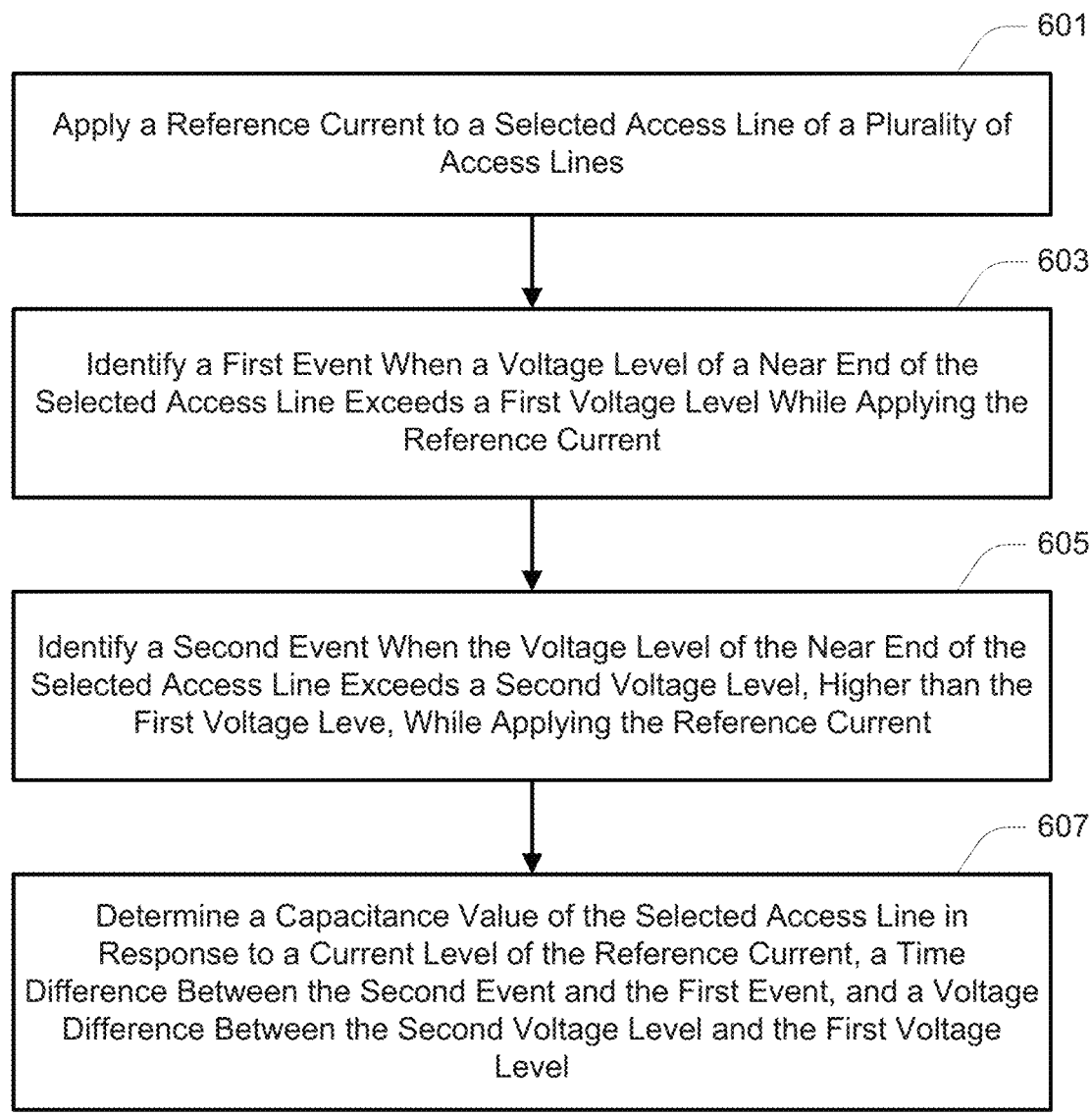
FIG. 6 is a method of operating a memory in accordance with an embodiment.

FIG. 6 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 601, a reference current might be applied to a selected access line of a plurality of access lines, e.g., a local access line 202. For example, the selected access line, e.g., a local access line 202, might be connected to a reference current source, e.g., through its respective global access line 302. The selected access line might further be connected to a first input of a comparator having a second input connected to a voltage node configured to receive a reference voltage, e.g., a variable reference voltage. For example, with reference to FIG. 5, the block select transistor 346 might receive a control signal from the block select line 348 sufficient to activate (e.g., a logic high level), the transistor 564 might receive a control signal from the node 570 sufficient to activate (e.g., a logic high level), and the transistor 566 might receive a control signal from the logic 572 sufficient to activate (e.g., a logic high level). In this manner, the local access line 202 might be connected to its respective global access line 302, the current source 562, and the first (e.g., non-inverting) input of the comparator 576.

At 603, a first event might be identified when a voltage level of a near end of the selected access line exceeds (e.g., is deemed to exceed) a first voltage level while applying the reference current. For example, with reference to FIG. 5, the voltage node 578 might be configured to receive the first voltage level as the reference voltage Vref. The voltage level of the node 574 might be deemed to represent the voltage level of the near end of the local access line 202. As the reference current Iref is applied to the node 574, the voltage level of the local access line 202 might be expected to rise. While the voltage level of the node 574 is below the first voltage level, the output of the comparator 576 might have a first logic level, e.g., a logic low level, and when the voltage level of the node 574 exceeds (e.g., is higher than) the first voltage level, the output of the comparator 576 might have a second logic level, e.g., a logic high level. Thus, a particular transition of the output of the comparator 576 to its second logic level, e.g., a logic high level in this example, might identify the first event.

In response to the particular transition of logic level of the output of the comparator 576 while the voltage node 578 is at the first voltage level, the logic 572 might start the counter 580. The logic 572 might start the counter 580 at an initial count value (e.g., a count value of zero). The logic 572 might further provide an indication on its output 584 configured to cause the voltage level of the voltage node 578 to increase to the second voltage level, higher than the first voltage level. As a result of increasing the voltage level of the voltage node 578, the output of the comparator 576 might transition back to its first logic level as the voltage level of the voltage node 578 might exceed the voltage level of the voltage node 574.

At 605, a second event might be identified when the voltage level of the near end of the selected access line exceeds (e.g., is deemed to exceed) a second voltage level while applying the reference current. For example, with reference to FIG. 5, while the voltage level of the node 574 is below the second voltage level, the output of the comparator 576 might have its first logic level, and when the voltage level of the node 574 exceeds the second voltage level, the output of the comparator 576 might again transition to its second logic level, and this particular transition might identify the second event.

In response to the particular transition of logic level of the output of the comparator 576 while the voltage node 578 is at the second voltage level, the logic 572 might stop the counter 580, or otherwise store the count value corresponding to the time of the second event.

At 607, a capacitance value of the selected access line might be determined in response to a current level of the reference current, a time difference between the second event and the first event, and a voltage difference between the second voltage level and the first voltage level.

The capacitance value might be determined (e.g., estimated) using the I-V equation:

$$V2 - V1 = \frac{1}{Cwl} * \int_{t1}^{t2} Iref \ dt \qquad \text{Eq. 1}$$

Where V1=the first voltage level
V2=the second voltage level
Cwl=the total capacitance
t2=the time of the second event
t1=the time of the first event
Iref=the reference current
Equation 1 might simplify to:

$$V2 - V1 = \frac{1}{Cwl} * Iref * (t2 - t1) \qquad \text{Eq. 2}$$

Equation 2 might be expressed alternatively as:

$$Cwl = \frac{Iref * (t2 - t1)}{(V2 - V1)} \qquad \text{Eq. 3}$$

Note that the capacitance Cwl in Equation 3 generally includes the capacitance of the local access line 202 along with parasitic capacitances of the global access line 302 and its connections to the current source 562 and the comparator 576. By repeating the method of FIG. 6 with the block select transistor 346 deactivated, a capacitance value of these parasitic capacitances might be determined while isolated from the local access line 202, and a corrected capacitance value removing the contribution of the parasitic capacitances might facilitate a more accurate determination (e.g., estimation) of the capacitance of the local access line 202 itself Voltage levels of the first voltage level and the second voltage level might be selected such that the difference in time between the first event and the second event is multiple times the expected RC time constant of the selected access line. For some embodiments, voltage levels of the first voltage level and the second voltage level might be selected such that an expected difference in time between the first event and the second event is at least two times the expected RC time constant of the selected access line. For further embodiments, voltage levels of the first voltage level and the second voltage level might be selected such that an expected difference in time between the first event and the second event is five times the expected RC time constant of the selected access line. In addition, for some embodiments, the voltage level of the first voltage level might be selected such that a time to reach the first event is multiple times the expected RC time constant of the selected access line.

The associated clock signal of the counter 580 might have a period on the order of 30 ns. Lower values of the period of the associated clock signal (e.g., higher frequencies) might facilitate more accurate determination of timing values. In general, the period of the associated clock signal of the counter 580 might be selected to be less than the expected RC time constant of the selected access line. For some embodiments, the period of the associated clock signal of the counter 580 might be at least an order of magnitude less than the expected RC time constant of the selected access line. For further embodiments, the period of the associated clock signal of the counter 580 might be two orders of magnitude less than the expected RC time constant of the selected access line.

Figure 7:
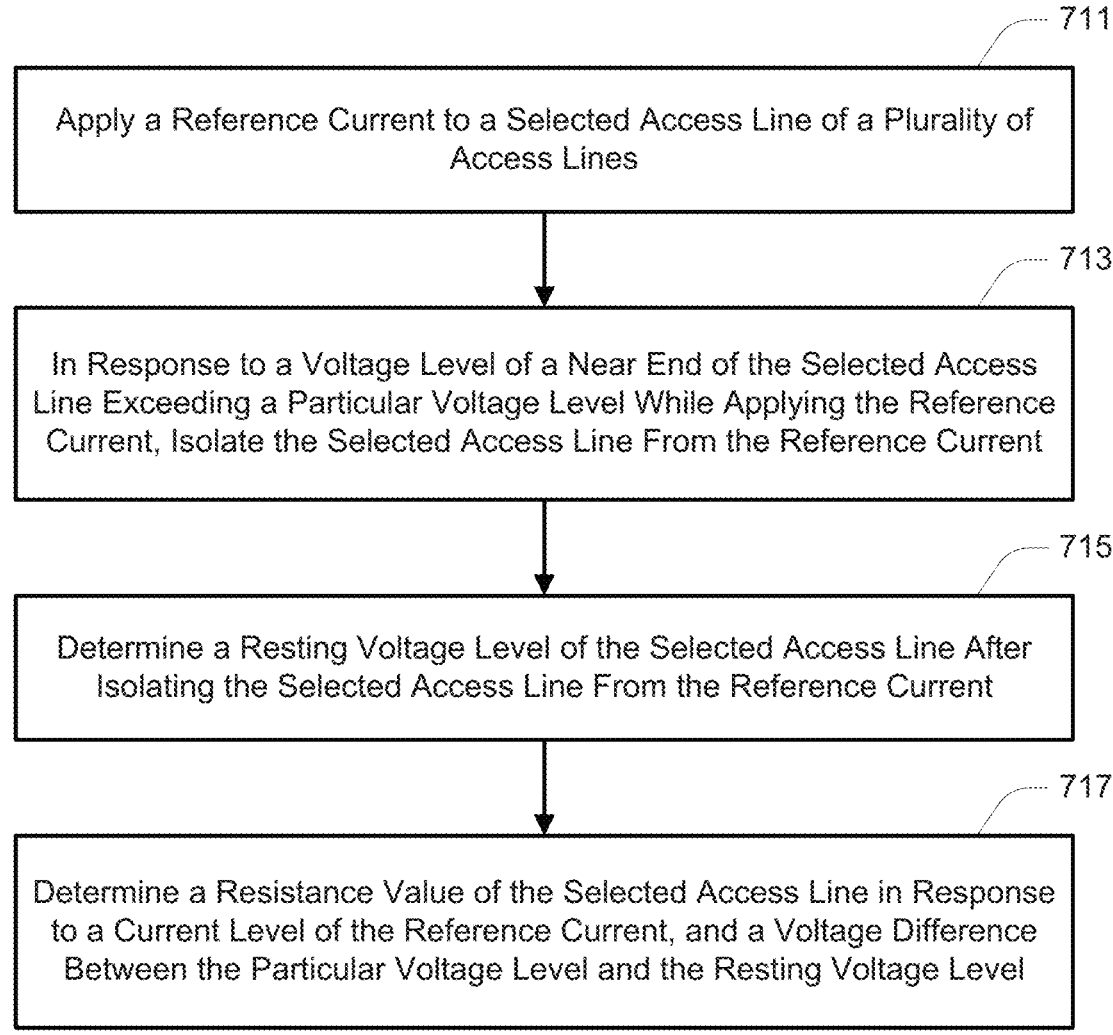
FIG. 7 is a method of operating a memory in accordance with another embodiment.

FIG. 7 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 711, a reference current might be applied to a selected access line of a plurality of access lines, e.g., a local access line 202. For example, the selected access line, e.g., a local access line 202, might be connected to a reference current source, e.g., through its respective global access line 302. The selected access line might further be connected to a first input of a comparator having a second input connected to a voltage node configured to receive a reference voltage, e.g., a variable reference voltage. For example, with reference to FIG. 5, the block select transistor 346 might receive a control signal from the block select line 348 sufficient to activate (e.g., a logic high level), the transistor 564 might receive a control signal from the node 570 sufficient to activate (e.g., a logic high level), and the transistor 566 might receive a control signal from the logic 572 sufficient to activate (e.g., a logic high level). In this manner, the local access line 202 might be connected to its respective global access line 302, the current source 562, and the first (e.g., non-inverting) input of the comparator 576. As the reference current Iref is applied to the node 574, the voltage level of the local access line 202 might be expected to rise.

At 713, the selected access line might be isolated from the reference current in response to a voltage level of a near end of the selected access line exceeding a particular voltage level while applying the reference current. For example, with reference to FIG. 5, the voltage node 578 might be configured to receive the particular voltage level as the reference voltage Vref. The voltage level of the node 574 might be deemed to represent the voltage level of the near end of the local access line 202. While the voltage level of the node 574 is below the particular voltage level, the output of the comparator 576 might have a first logic level, e.g., a logic low level, and when the voltage level of the node 574 exceeds the particular voltage level, the output of the comparator 576 might have a second logic level, e.g., a logic high level. Thus, a particular transition of the output of the comparator 576 to its second logic level, e.g., a logic high level in this example, might identify when the voltage level of the node 574 exceeds the particular voltage level.

In response to the particular transition of logic level of the output of the comparator 576 while the voltage node 578 is at the particular voltage level, the logic 572 might deactivate the transistor 566, e.g., by applying a logic low level to its output 582, and thus to the control gate of the transistor 566. This might isolate the global access line 302, and thus the local access line 202, from the current source 562. The local access line 202 might be allowed to electrically float. Note that the block select transistor 346 and the transistor 564 might remain activated while the local access line 202 is allowed to electrically float.

At 715, a resting voltage level of the selected access line might be determined after isolating the selected access line from the reference current. The resting voltage level might represent an equilibrated voltage level of the selected access line while electrically floating. For example, when the near end of the selected access line exceeds the particular voltage level, the far end of the selected access line might be expected to have a voltage level lower than the particular voltage level due to the RC characteristics of the selected access line, and the resulting delayed response at the far end of the selected access line. However, due to conservation of charge, the near end and the far end of the selected access line might be expected to settle to a same voltage level after sufficient resting time.

The selected access line might be allowed to rest (e.g., electrically float) for a period of time that is multiple times the expected RC time constant of the selected access line. For some embodiments, the selected access line might be allowed to electrically float for at least two times the expected RC time constant of the selected access line. For further embodiments, the selected access line might be allowed to electrically float for five times the expected RC time constant of the selected access line. The period of resting might be determined using the counter 580. For example, the count value of the counter 580 might be set to an initial value, and the period of resting might correspond to a particular count value. For example, where the associated clock signal of the counter 580 has a period of 30 ns, a resting period of 5 µs might correspond, approximately, to a count value of 167 from an initial count value of zero.

The resting voltage level might be determined by reducing (e.g., decrementing) the voltage level applied to the node 578, e.g., while the selected access line is electrically floating. A different transition, e.g., different than the particular transition, of the output of the comparator 576 to its first logic level, e.g., a logic low level in this example, might identify when the voltage level of the node 578 exceeds the voltage level of the node 574. The voltage level of the node 578 deemed to cause the different transition of the output of the comparator 576 might be deemed to represent (e.g., equal) the resting voltage level. Smaller values of ΔV for the decrements of the node 578 might facilitate higher accuracy in the determinations of the resting voltage level. For embodiments where the voltage level of the reference voltage Vref is generated using a digital-to-analog converter (DAC), decreasing the voltage level of the reference voltage Vref might involve decrementing the input value to the DAC.

At 717, a resistance value of the selected access line might be determined in response to a current level of the reference current, and a voltage difference between the particular voltage level and the resting voltage level.

The resistance value might be dependent upon the selected distributed RC model. For example, for the Pi model, the law of conservation of electric charge might lead to the following equation:

$$Vfinal * Cwl = V2 * \frac{Cwl}{2n} + \left(V2 - \frac{(2n-1)*Iref}{2n} * \frac{Rwl}{n}\right) * \frac{Cwl}{n} + \left(V2 - \frac{(2n-1)*Iref}{2n} * \frac{Rwl}{n} - \frac{(2n-3)*Iref}{2n} * \frac{Rwl}{n}\right) * \frac{Cwl}{n} + \ldots \quad \text{Eq. 4}$$

Where V2=the particular voltage level
Vfinal=the resting voltage level
Cwl=the total capacitance
Rwl=the total resistance
Iref=the reference current
Equation 4 might simplify to:

$$Vfinal = V2 * \frac{1}{2n} + \left(V2 - \frac{(2n-1)*Iref}{2n} * \frac{Rwl}{n}\right) * \frac{1}{n} + \left(V2 - \frac{(2n-1)*Iref}{2n} * \frac{Rwl}{n} - \frac{(2n-3)*Iref}{2n} * \frac{Rwl}{n}\right) * \frac{1}{n} + \ldots \quad \text{Eq. 5}$$

Equation 5 might further simplify to:

$$V2 - Vfinal = \frac{Iref * Rwl}{2n^3} \sum_{k=0}^{n-1} (2n - 1 - 2k) * \left(n - \frac{1}{2} - k\right) \quad \text{Eq. 6}$$

As n→∞, Equation 6 might be expressed as:

$$V2 - Vfinal = \frac{Iref * Rwl}{n^3} \sum_{k=0}^{n-1} k^2 \quad \text{Eq. 7}$$

Equation 7 might resolve as:

$$V2 - Vfinal = \frac{Iref * Rwl}{3} \quad \text{Eq. 8}$$

Equation 8 might be alternatively expressed as:

$$Rwl = \frac{3 * (V2 - Vfinal)}{Iref} \quad \text{Eq. 9}$$

Note that the resistance Rwl in Equation 9 generally includes the resistance of the local access line 202 along with resistances of the global access line 302 and its connections to the current source 562 and the comparator 576. By repeating the method of FIG. 7 with the block select transistor 346 deactivated, a resistance value of these resistances might be determined while isolated from the local access line 202, and a corrected resistance value removing the contribution of the additional resistances might facilitate a more accurate determination (e.g., estimation) of the resistance of the local access line 202 itself.

Figure 8:
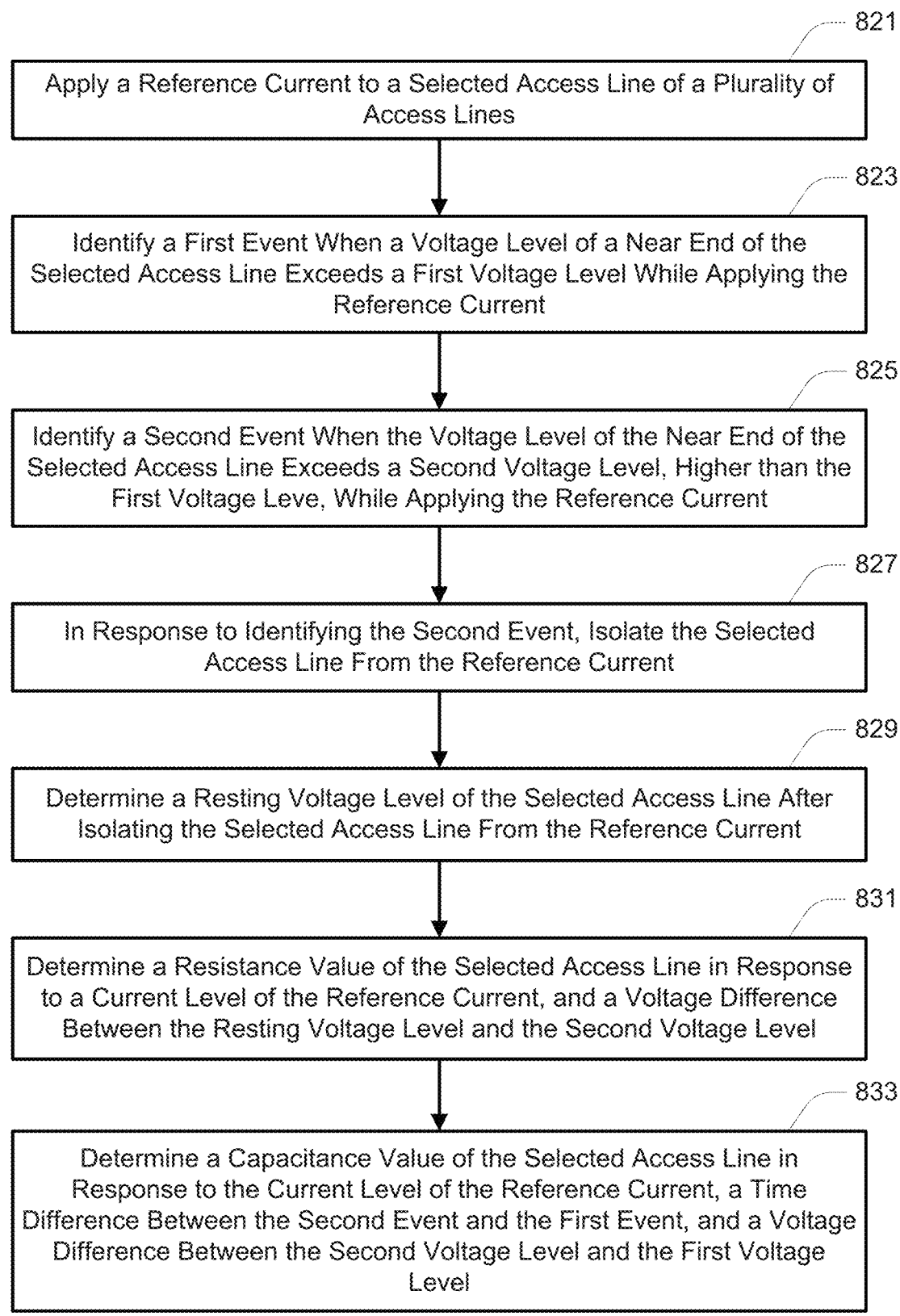
FIG. 8 is a method of operating a memory in accordance with a further embodiment.

FIG. 8 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method. The method of FIG. 8 might represent processing of the methods of FIGS. 6 and 7 to concurrently determine both capacitance values and resistance values.

At 821, a reference current might be applied to a selected access line of a plurality of access lines, e.g., a local access line 202. For example, the selected access line, e.g., a local access line 202, might be connected to a reference current source, e.g., through its respective global access line 302. The selected access line might further be connected to a first input of a comparator having a second input connected to a voltage node configured to receive a reference voltage, e.g., a variable reference voltage. For example, with reference to FIG. 5, the block select transistor 346 might receive a control signal from the block select line 348 sufficient to activate (e.g., a logic high level), the transistor 564 might receive a control signal from the node 570 sufficient to activate (e.g., a logic high level), and the transistor 566 might receive a control signal from the logic 572 sufficient to activate (e.g., a logic high level). In this manner, the local access line 202 might be connected to its respective global access line 302, the current source 562, and the first (e.g., non-inverting) input of the comparator 576.

At 823, a first event might be identified when a voltage level of a near end of the selected access line exceeds (e.g., is deemed to exceed) a first voltage level while applying the reference current. For example, with reference to FIG. 5, the voltage node 578 might be configured to receive the first voltage level as the reference voltage Vref. The voltage level of the node 574 might be deemed to represent the voltage level of the near end of the local access line 202. As the reference current Iref is applied to the node 574, the voltage level of the local access line 202 might be expected to rise. While the voltage level of the node 574 is below the first voltage level, the output of the comparator 576 might have a first logic level, e.g., a logic low level, and when the voltage level of the node 574 exceeds the first voltage level, the output of the comparator 576 might have a second logic level, e.g., a logic high level. Thus, a particular transition of the output of the comparator 576 to its second logic level, e.g., a logic high level in this example, might identify the first event.

In response to the particular transition of logic level of the output of the comparator 576 while the voltage node 578 is at the first voltage level, the logic 572 might start the counter 580. The logic 572 might start the counter 580 at an initial count value (e.g., a count value of zero). The logic 572 might further provide an indication on its output 584 configured to cause the voltage level of the voltage node 578 to increase to the second voltage level, higher than the first voltage level. As a result of increasing the voltage level of the voltage node 578, the output of the comparator 576 might transition back to its first logic level as the voltage level of the voltage node 578 exceeds the voltage level of the voltage node 574.

At 825, a second event might be identified when the voltage level of the near end of the selected access line exceeds (e.g., is deemed to exceed) a second voltage level while applying the reference current. For example, with reference to FIG. 5, while the voltage level of the node 574 is below the second voltage level, the output of the comparator 576 might have its first logic level, and when the voltage level of the node 574 exceeds the second voltage level, the output of the comparator 576 might again transition to its second logic level, and this particular transition might identify the second event.

In response to the particular transition of logic level of the output of the comparator 576 while the voltage node 578 is at the second voltage level, the logic 572 might stop the counter 580, or otherwise store the count value corresponding to the time of the second event.

At 827, the selected access line might be isolated from the reference current in response to identifying the second event. For example, in response to the particular transition of logic level of the output of the comparator 576 while the voltage node 578 is at the second voltage level, the logic 572 might deactivate the transistor 566, e.g., by applying a logic low level to its output 582. This might isolate the global access line 302, and thus the local access line 202, from the current source 562. The local access line 202 might be allowed to electrically float. Note that the block select transistor 346 and the transistor 564 might remain activated while the local access line 202 is allowed to electrically float.

At 829, a resting voltage level of the selected access line might be determined after isolating the selected access line from the reference current. The resting voltage level might represent an equilibrated voltage level of the selected access line while electrically floating, as discussed with reference to FIG. 7.

At 831, a resistance value of the selected access line might be determined in response to a current level of the reference current, and a voltage difference between the resting voltage level and the second voltage level. As discussed with reference to FIG. 7, this resistance value might be corrected by repeating the method of FIG. 8 while the block select transistor 346 is deactivated.

At 833, a capacitance value of the selected access line might be determined in response to a current level of the reference current, a time difference between the second event and the first event, and a voltage difference between the second voltage level and the first voltage level. As discussed with reference to FIG. 6, this capacitance value might be corrected by repeating the method of FIG. 8 while the block select transistor 346 is deactivated.

Figure 9:
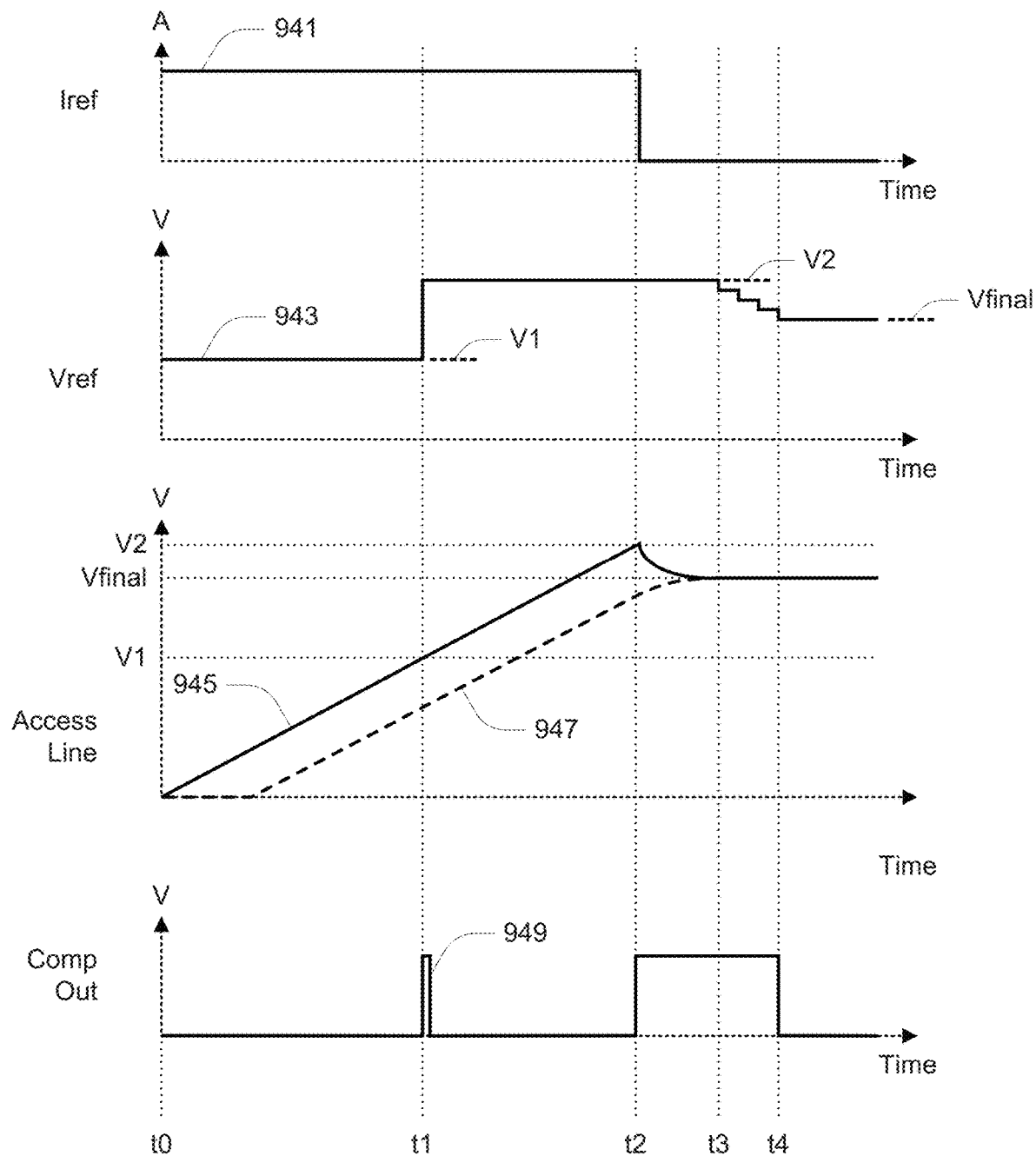
FIG. 9 depicts timing of various parameters of FIG. 4 in accordance with an embodiment.

FIG. 9 depicts timing of various parameters of FIG. 5 in accordance with an embodiment. FIG. 9 might correspond to a method of the type discussed with reference to FIG. 8. Trace 941 might correspond to the current level of the reference current Iref over time. Trace 943 might correspond to the voltage level of the reference voltage Vref over time. Trace 945 might correspond to the voltage level of the near end of the selected access line (e.g., as represented at the node 574) over time. Trace 947 might correspond to the voltage level of the far end of the selected access line over time. Note that trace 947 might represent an expectation of the delayed response to the reference current, and that the voltage level of trace 947 might not be determinable in practice. Trace 949 might correspond to the logic level of the output of the comparator 576 over time.

At time t0, the selected access line might be connected to receive the reference current Iref. The reference voltage Vref might have the first voltage level V1. And the comparator 576 might have a logic low level at its output in response to the voltage level of Vref exceeding the voltage level of the selected access line. In response to the reference current, trace 945 might be expected to increase.

At time t1, in response to the voltage level of the selected access line increasing to a point that it is higher than the first voltage level V1, the logic level of the output of the comparator 576 might transition to a logic high level. In response, the voltage level of the reference voltage Vref might be increased to the second voltage level V2. In response to the voltage level of the reference voltage Vref being increased to a voltage level exceeding the voltage level of the selected access line, the output of the comparator might transition back to the logic low level.

At time t2, in response to the voltage level of the selected access line increasing to a point that it is higher than the second voltage level, the logic level of the output of the comparator 576 might again transition to a logic high level. In response, the selected access line might be isolated from the reference current Iref. The selected access line might be allowed to electrically float. As the selected access line is electrically floated, the voltage level of trace 945 might be expected to decrease to a resting (e.g., equilibrated) voltage level. The selected access line might be deemed to reach its resting voltage level after a period of time deemed to be a multiple of the expected RC time constant of the selected access line.

At time t3, after the voltage level of the selected access line is deemed to reach the resting voltage level Vfinal, the voltage level of the reference voltage Vref might be decreased (e.g., decremented) until the output of the comparator 576 transitions back to the logic low level, e.g., indicating that the voltage level Vref has decreased to a voltage level below the resting voltage level Vfinal. For some embodiments, the voltage level of the reference voltage Vref deemed to cause the transition of the output of the comparator 576 at time t4, might be deemed to equal the resting voltage level Vfinal. Smaller values of ΔV for the decrements of the reference voltage level Vref might facilitate higher accuracy of the determination of the resting voltage level Vfinal.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells;
a plurality of access lines, wherein each access line of the plurality of access lines is connected to control gates of a respective plurality of memory cells of the array of memory cells; and
a controller for access of the array of memory cells, wherein the controller is configured to cause the apparatus to:
apply a reference current to a selected access line of the plurality of access lines;
identify a first event when a voltage level of a near end of the selected access line is deemed to exceed a first voltage level while applying the reference current;
identify a second event when the voltage level of the near end of the selected access line is deemed to exceed a second voltage level, higher than the first voltage level, while applying the reference current; and
determine a capacitance value of the selected access line in response to a current level of the reference current, a time difference between the second event and the first event, and a voltage difference between the second voltage level and the first voltage level.

2. The apparatus of claim 1, wherein the controller being configured to cause the apparatus to apply the reference current to the selected access line comprises the controller being configured to cause the apparatus to connect the selected access line to a current source.

3. The apparatus of claim 2, wherein the plurality of access lines is a plurality of local access lines, wherein the selected access line is a selected local access line of the plurality of local access lines, and wherein the controller being configured to cause the apparatus to connect the selected local access line to the current source comprises the controller being configured to cause the apparatus to connect the selected local access line to the current source through a particular global access line, wherein the particular global access line is selectively connected to the selected local access line and selectively connected to a different local access line of the plurality of local access lines.

4. The apparatus of claim 3, wherein the controller being configured to cause the apparatus to determine the capacitance value of the selected access line comprises the controller being configured to cause the apparatus to determine a first capacitance value of the selected access line while connected to the particular global access line and determine a second capacitance value while the particular global access line is isolated from the selected local access line, and determine a corrected capacitance value of the selected access line in response to the first capacitance value and the second capacitance value.

5. The apparatus of claim 1, further comprising:
a comparator having a first input selectively connected to the near end of the selected access line, a second input connected to a voltage node configured to receive a variable reference voltage level, and an output;
wherein the controller being configured to cause the apparatus to identify the first event when the voltage level of the near end of the selected access line is deemed to exceed the first voltage level comprises the controller being configured to cause the apparatus to:
apply the first voltage level to the second input of the comparator while the first input of the comparator is connected to the selected access line; and
determine when the output of the comparator makes a particular transition while applying the first voltage level to its second input.

6. The apparatus of claim 5, wherein the controller being configured to cause the apparatus to identify the second event when the voltage level of the near end of the selected access line is deemed to exceed the second voltage level comprises the controller being configured to cause the apparatus to:
apply the second voltage level to the second input of the comparator while the first input of the comparator is connected to the selected access line; and
determine when the output of the comparator makes the particular transition while applying the second voltage level to its second input.

7. The apparatus of claim 1, wherein the controller being configured to cause the apparatus to determine the capacitance value of the selected access line comprises the controller being configured to cause the apparatus to determine the capacitance value of the selected access line according to the equation $Cwl=Iref*(t2-t1)/(V2-V1)$, where Cwl is the capacitance value of the selected access line, Iref is the current level of the reference current, t2 is a time of the second event, t1 is a time of the first event, V2 is the second voltage level, and V1 is the first voltage level.

8. The apparatus of claim 1, wherein the first voltage level and the second voltage level are selected such that a time difference between the second event and the first event is a multiple of an expected RC time constant of the selected access line.

9. The apparatus of claim 1, wherein the first voltage level and the second voltage level are selected such that the time difference between the second event and the first event is at least two times the expected RC time constant of the selected access line.

10. An apparatus, comprising:
an array of memory cells;
a plurality of access lines, wherein each access line of the plurality of access lines is connected to control gates of a respective plurality of memory cells of the array of memory cells; and

21 a controller for access of the array of memory cells, wherein the controller is configured to cause the apparatus to:
  apply a reference current to a selected access line of the plurality of access lines;
  isolate the selected access line from the reference current in response to a voltage level of a near end of the selected access line being deemed to exceed a particular voltage level while applying the reference current;
  determine a resting voltage level of the selected access line after isolating the selected access line from the reference current; and
  determine a resistance value of the selected access line in response to a current level of the reference current and a voltage difference between the particular voltage level and the resting voltage level.

11. The apparatus of claim 10, wherein the controller being configured to cause the apparatus to apply the reference current to the selected access line comprises the controller being configured to cause the apparatus to connect the selected access line to a current mirror.

12. The apparatus of claim 11, wherein the plurality of access lines is a plurality of local access lines, wherein the selected access line is a selected local access line of the plurality of local access lines, and wherein the controller being configured to cause the apparatus to connect the selected local access line to the current mirror comprises the controller being configured to cause the apparatus to:
  activate a first transistor between the selected local access line and a particular global access line, wherein the particular global access line is further selectively connected to a different local access line of the plurality of local access lines through a second transistor;
  activate a third transistor between the particular global access line and a particular node; and
  activate a fourth transistor between the particular node and the current mirror.

13. The apparatus of claim 12, wherein the controller being configured to cause the apparatus to determine the resistance value of the selected access line comprises the controller being configured to cause the apparatus to determine a first resistance value of the selected access line while the first transistor is activated, determine a second resistance value while the first transistor is deactivated, and determine a corrected resistance value of the selected access line in response to the first resistance value and the second resistance value.

14. The apparatus of claim 12, further comprising:
  a comparator having a first input connected to the particular node, a second input connected to a voltage node configured to receive a variable reference voltage level, and an output;
  wherein the controller being configured to cause the apparatus to isolate the selected access line from the reference current in response to the voltage level of the near end of the selected access line being deemed to exceed the particular voltage level while applying the reference current comprises the controller being configured to cause the apparatus to:
    apply the particular voltage level to the second input of the comparator while the first transistor, the third transistor and the fourth transistor are each activated;
    determine when the output of the comparator makes a particular transition while applying the particular voltage level to its second input; and
    deactivating the fourth transistor in response to the output of the comparator making the particular transition while applying the particular voltage level to its second input.

15. The apparatus of claim 10, wherein the controller being configured to cause the apparatus to determine the resistance value of the selected access line comprises the controller being configured to cause the apparatus to determine the resistance value of the selected access line according to the equation $Rwl=3*(V2-Vfinal)/Iref$, where $Rwl$ is the resistance value of the selected access line, $Iref$ is the current level of the reference current, $V2$ is the second voltage level, and $Vfinal$ is the resting voltage level.

16. An apparatus, comprising:
  an array of memory cells;
  a plurality of access lines, wherein each access line of the plurality of access lines is connected to control gates of a respective plurality of memory cells of the array of memory cells; and
  a controller for access of the array of memory cells, wherein the controller is configured to cause the apparatus to:
    apply a reference current to a selected access line of the plurality of access lines;
    identify a first event when a voltage level of a near end of the selected access line is deemed to exceed a first voltage level while applying the reference current;
    identify a second event when the voltage level of the near end of the selected access line is deemed to exceed a second voltage level, higher than the first voltage level, while applying the reference current;
    isolate the selected access line from the reference current in response to identifying the second event;
    determine a resting voltage level of the selected access line after isolating the selected access line from the reference current;
    determine a resistance value of the selected access line in response to a current level of the reference current and a voltage difference between the second voltage level and the resting voltage level; and
    determine a capacitance value of the selected access line in response to the current level of the reference current, a time difference between the second event and the first event, and a voltage difference between the second voltage level and the first voltage level.

17. The apparatus of claim 16, wherein the plurality of access lines is a plurality of local access lines, wherein the selected access line is a selected local access line of the plurality of local access lines, and wherein the controller being configured to cause the apparatus to apply the reference current to the selected local access line comprises the controller being configured to cause the apparatus to:
  activate a first transistor between the selected local access line and a particular global access line, wherein the particular global access line is further selectively connected to a different local access line of the plurality of local access lines through a second transistor;
  activate a third transistor between the particular global access line and a particular node; and
  activate a fourth transistor between the particular node and a current source generating the reference current.

18. The apparatus of claim 17, further comprising:
  a comparator having a first input connected to the particular node, a second input connected to a voltage node configured to receive a variable reference voltage level, and an output;

wherein the controller being configured to cause the apparatus to identify the second event when the voltage level of the near end of the selected access line is deemed to exceed the second voltage level comprises the controller being configured to cause the apparatus to:
- apply the second voltage level to the voltage node while the first transistor, the third transistor and the fourth transistor are each activated; and
- determine when the output of the comparator makes a particular transition while applying the second voltage level to the voltage node.

19. The apparatus of claim 18, wherein the controller being configured to cause the apparatus to determine the resting voltage level of the selected access line comprises the controller being configured to cause the apparatus to:
- decrease the voltage level applied to the voltage node while the fourth transistor is deactivated, and while the first transistor and the third transistor are each activated; and
- determine when the output of the comparator makes a different transition while applying the second voltage level to the voltage node.

20. The apparatus of claim 19, wherein the controller being configured to cause the apparatus to decrease the voltage level applied to the voltage node comprises the controller being configured to cause the apparatus to decrement the voltage level applied to the voltage node.

\* \* \* \* \*